United States Patent
Kumar et al.

(10) Patent No.: US 8,130,030 B2
(45) Date of Patent: *Mar. 6, 2012

(54) INTERFACING BETWEEN DIFFERING VOLTAGE LEVEL REQUIREMENTS IN AN INTEGRATED CIRCUIT SYSTEM

(75) Inventors: Pankaj Kumar, Karnataka (IN); Pramod Elamannu Parameswaran, Karnataka (IN); Makeshwar Kothandaraman, Whitehall, PA (US); Vani Deshpande, Karnataka (IN); John Kriz, Palmerton, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/610,276

(22) Filed: Oct. 31, 2009

(65) Prior Publication Data
US 2011/0102045 A1    May 5, 2011

(51) Int. Cl.
*G05F 1/10* (2006.01)
(52) U.S. Cl. ........................................... 327/543
(58) Field of Classification Search .................. 327/306, 327/543, 547
See application file for complete search history.

(56) References Cited

U.S. PATENT DOCUMENTS

| | | | |
|---|---|---|---|
| 5,576,635 A | 11/1996 | Partovi et al. | |
| 6,114,901 A * | 9/2000 | Singh et al. | 327/543 |
| 6,300,800 B1 | 10/2001 | Schmitt et al. | |
| 6,333,663 B1 * | 12/2001 | Lee | 327/333 |
| 6,859,074 B2 | 2/2005 | Ajit | |
| 6,927,602 B2 | 8/2005 | Ker et al. | |
| 7,002,379 B2 | 2/2006 | Ajit | |
| 7,071,764 B1 | 7/2006 | Kiani | |
| 7,477,075 B2 | 1/2009 | Kesselring | |
| 7,573,304 B2 | 8/2009 | Takemura et al. | |
| 7,642,841 B2 * | 1/2010 | Jung et al. | 327/538 |
| 2006/0170054 A1 | 8/2006 | Mergens et al. | |
| 2009/0027089 A1 | 1/2009 | Hebenstreit | |

\* cited by examiner

*Primary Examiner* — Hai L Nguyen
(74) *Attorney, Agent, or Firm* — Raj Abhyanker, P.C.

(57) ABSTRACT

A method includes controllably generating a first bias voltage from a supply voltage to be within an upper tolerable limit of an operating voltage of an IO receiver, and controllably generating a second bias voltage from an external voltage supplied through an IO pad to be within the upper tolerable limit of the operating voltage of the IO receiver. The method also includes deriving an output voltage from the first bias voltage during a normal condition and a tolerant condition, and deriving the output voltage from the second bias voltage during a failsafe condition. The tolerant condition is a mode of operation where the external voltage supplied through the IO pad varies from zero to a value higher than the supply voltage, and the failsafe condition is a mode of operation where the supply voltage is zero.

20 Claims, 9 Drawing Sheets

INTERFACING BETWEEN DIFFERING VOLTAGE LEVEL REQUIREMENTS IN AN INTEGRATED CIRCUIT SYSTEM

FIELD OF TECHNOLOGY

This disclosure relates generally to electronic circuits and, more particularly, to a method, an apparatus, and a system to realize an Input/Output (IO) interface circuit capable of reliably interfacing between differing voltage level requirements.

BACKGROUND

Figure 1:
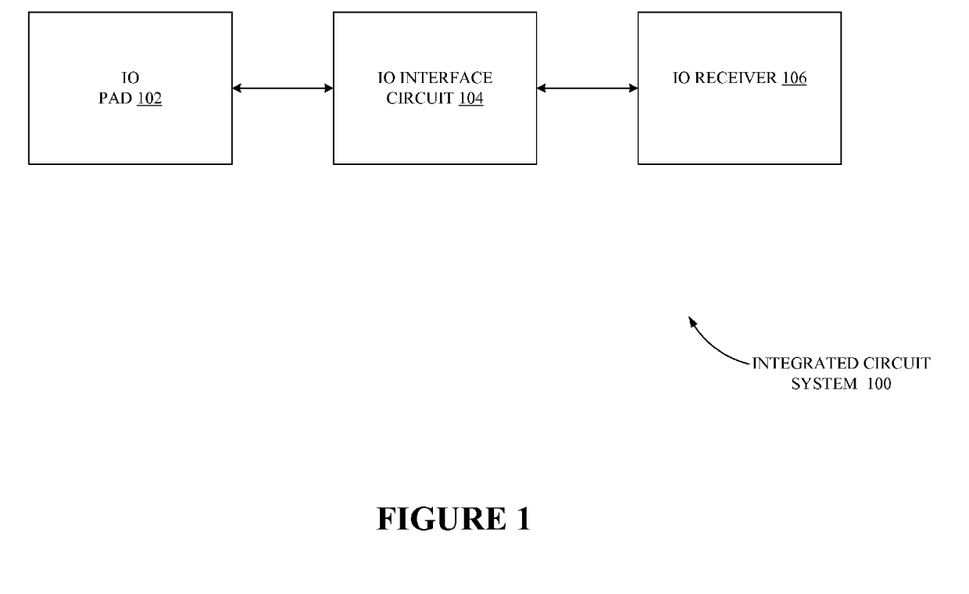
FIG. 1 is a system view of an Integrated Circuit (IC) system including an Input/Output (IO) interface circuit.

An Input/Output (IO) interface circuit 104 may interface an IO pad 102 of an Integrated Circuit (IC) with an IO receiver 106, as shown in FIG. 1. The IO pad may allow for the IC to be connected to external devices. The IC system 100 of FIG. 1 may require different voltage levels for the IO pad 102 and the IO receiver 106. For example, the voltage at the IO pad 102 may be high (e.g., 3.465, 5.5 V, or, 3.3 V+5% tolerance, 5V+10% tolerance) and the operating voltage of the IO receiver may be low (e.g., 2.5V). The supply voltage may also be at a different voltage level.

The constituent active elements (e.g., Metal-Oxide-Semiconductor (MOS) transistors) of the IO interface circuit 104 and the IO receiver 106 may also have an upper tolerable limit of the operating voltage thereof (e.g., 1.98 V, or, 1.8 V+10% tolerance). When a voltage higher than the operating voltage of the receiver (e.g., 2.5 V) is input to the receiver, constituent active elements of the IO receiver 106 may be stressed, which may affect the reliability of the IO receiver 106. Similarly, the constituent active elements of the IO interface circuit 104 may also be stressed.

Considering a MOS transistor as the active element, when the voltage across the drain (D) terminal and the gate (G) terminal of the MOS transistor exceeds an upper limit, the gate (G) oxide of the MOS transistor under stress may break down.

SUMMARY

Disclosed are a method, an apparatus, and a system to realize an Input/Output (IO) interface circuit to interface between differing voltage level requirements.

In one aspect, a method includes controllably generating a first bias voltage from a supply voltage to be within an upper tolerable limit of an operating voltage of an IO receiver, and controllably generating a second bias voltage from an external voltage supplied through an IO pad to be within the upper tolerable limit of the operating voltage of the IO receiver. The method also includes deriving an output voltage from the first bias voltage during a normal condition and a tolerant condition, and deriving the output voltage from the second bias voltage during a failsafe condition.

The tolerant condition is a mode of operation where the external voltage supplied through the IO pad varies from zero to a value higher than the supply voltage, and the failsafe condition is a mode of operation where the supply voltage is zero.

In another aspect, a circuit includes a multiplexer block. The multiplexer block is configured to receive a first bias voltage controllably generated from a supply voltage and a second bias voltage controllably generated from an external voltage supplied through an IO pad. The first bias voltage and the second bias voltage are both within an upper tolerable limit of an operating voltage of an IO receiver. The multiplexer block is configured to output the first bias voltage during a normal condition and a tolerant condition or an output based on the second bias voltage during a failsafe condition based on a corresponding presence or absence of the supply voltage.

The tolerant condition is a mode of operation where the external voltage supplied through the IO pad varies from zero to a value higher than the supply voltage, and the failsafe condition is a mode of operation where the supply voltage is zero.

In yet another aspect, an integrated circuit system includes an IO pad of an integrated circuit, an IO receiver, and an IO interface circuit configured to interface the IO pad of the integrated circuit with the IO receiver. The IO interface circuit includes a multiplexer block. The multiplexer block is configured to receive a first bias voltage controllably generated from a supply voltage and a second bias voltage controllably generated from an external voltage supplied through an IO pad of the integrated circuit. The first bias voltage and the second bias voltage are both within an upper tolerable limit of an operating voltage of the IO receiver. The multiplexer block is configured to output the first bias voltage during a normal condition and a tolerant condition or an output based on the second bias voltage during a failsafe condition based on a corresponding presence or absence of the supply voltage.

The tolerant condition is a mode of operation where the external voltage supplied through the IO pad of the integrated circuit varies from zero to a value higher than the supply voltage, and the failsafe condition is a mode of operation where the supply voltage is zero.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to realize an Input/Output (IO) interface circuit capable of interfacing between differing voltage level requirements. Although the present embodiments have been described with reference to specific example embodiments, it will be evident that various modifications and changes may be made to these embodiments without departing from the broader spirit and scope of the various embodiments.

Figure 2:
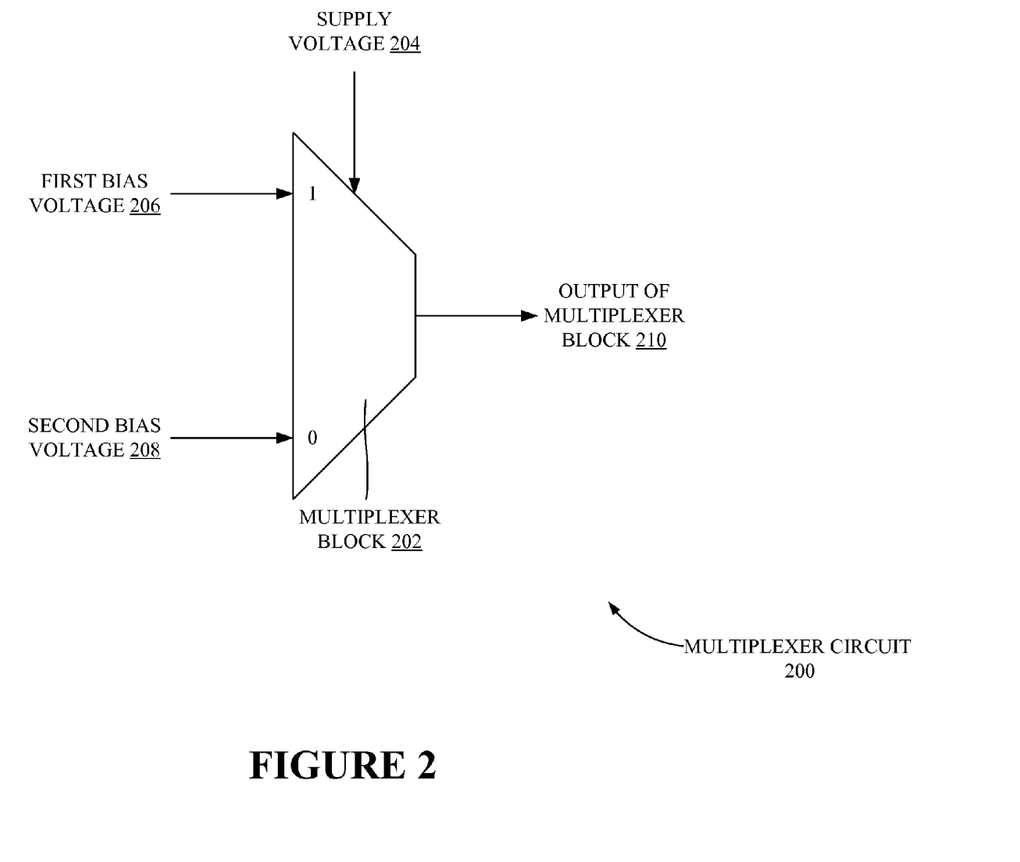
FIG. 2 is a schematic view of a multiplexer circuit, according to one or more embodiments.

FIG. 2 shows a multiplexer circuit 200, according to one or more embodiments. In one or more embodiments, the multiplexer circuit 200 includes a multiplexer block 202 that may receive a first bias voltage 206 and a second bias voltage 208 as the inputs. In one or more embodiments, the first bias voltage 206 may be controllably generated from a supply voltage 204, and the second bias voltage 208 may be controllably generated from an external voltage supplied through an Input/Output (IO) pad. In one or more embodiments, the first bias voltage 206 and the second bias voltage 208 may be within an upper tolerable limit of an operating voltage of an IO receiver.

In one or more embodiments, the output of the multiplexer block 210 may be the first bias voltage 206 during a normal condition and a tolerant condition or an output based on the second bias voltage 208 during a failsafe condition. In one or more embodiments, the tolerant condition may be a mode of operation where the external voltage supplied through the IO pad varies from zero to a value higher than the supply voltage 204. In one or more embodiments, the failsafe condition may be a mode of operation where the supply voltage 204 is zero.

In other words, as shown in FIG. 2, the output of the multiplexer block 210 may be based on the presence or absence of the supply voltage 204. For example, when the supply voltage 204 is present, which indicates a logic "1," the output of the multiplexer block 210 may be equal to the first bias voltage 206. When the supply voltage 204 is zero, which indicates a logic "0," the output of the multiplexer block 210 may be based on the second bias voltage 208.

In one or more embodiments, the first bias voltage 206 may be controllably generated as a fraction of the supply voltage 204. In one or more embodiments, the second bias voltage 208 may be controllably generated as the external voltage supplied through the IO pad reduced by a threshold voltage of one or more active element(s) (e.g., Metal-Oxide-Semiconductor (MOS) transistors).

Figure 3:
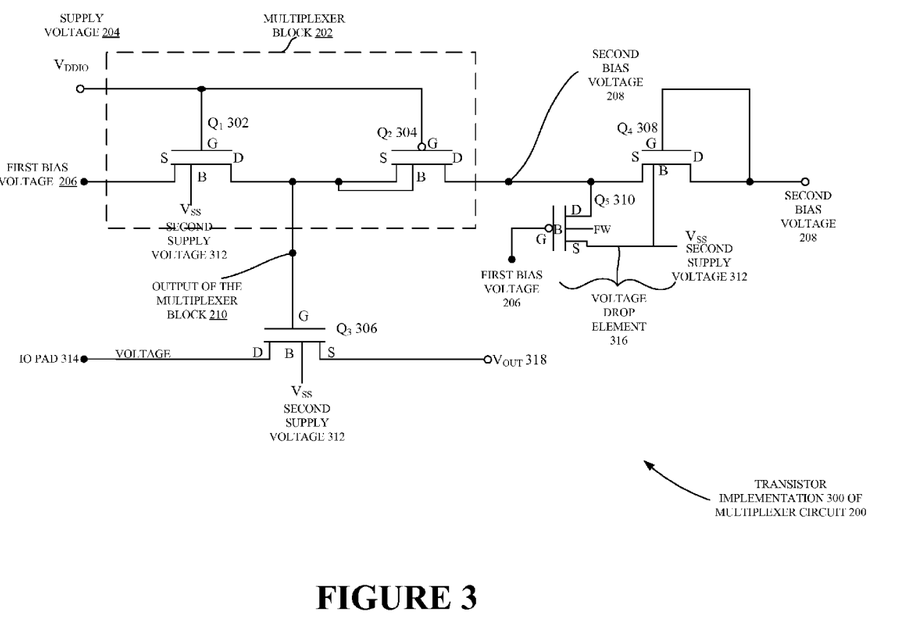
FIG. 3 is a schematic view of a transistor implementation of the multiplexer circuit of FIG. 2, according to one or more embodiments.

FIG. 3 shows a transistor implementation 300 of the multiplexer circuit 200 of FIG. 2, according to one or more embodiments. It is obvious to one of ordinary skill in the art that the source (S) and drain (D) terminals of a MOS transistor are interchangeable and, therefore, coupling a voltage to the source (S) terminal and outputting another voltage from the drain (D) terminal is equivalent to coupling the voltage to the drain (D) terminal and outputting another voltage from the source (S) terminal. A drain-drain (D-D) path may also be equivalent to a source-drain (S-D) path.

In one or more embodiments, the multiplexer block 202 includes a first MOS transistor $Q_1$ 302 configured to receive the first bias voltage 206 at the source (S) terminal thereof, and a second MOS transistor $Q_2$ 304 configured to receive the second bias voltage 208 at the drain (D) terminal thereof. In one or more embodiments, the second bias voltage 208 may also be further reduced by a voltage drop element 316, as shown in FIG. 3. In one or more embodiments, the voltage drop element 316 may be resistive. In one or more embodiments, the voltage drop element 316 may include active elements (e.g., MOS transistors) connected as shown in FIG. 3.

In one or more embodiments, the gate (G) terminals of $Q_1$ 302 and $Q_2$ 304 may both be configured to receive the supply voltage 204 ($V_{DDIO}$ 204). In one or more embodiments, the drain (D) terminal of $Q_1$ 302 may be coupled to the source (S) terminal of $Q_2$ 304. In one or more embodiments, the bulk (B) terminal of $Q_1$ 302 may be held at a second supply voltage 312 ($V_{SS}$ 312), and the bulk (B) terminal of Q2 304 may be coupled to the source (S) terminal thereof. In one or more embodiments, the output of the multiplexer block 210 may be obtained from the drain-source (D-S) path between $Q_1$ 302 and $Q_2$ 304.

In one or more embodiments, the first bias voltage 206 may be a fraction of $V_{DDIO}$ 204 (e.g., $0.7V_{DDIO}$). In one or more embodiments, the second bias voltage 208 may be derived from the external voltage supplied through the IO pad (IO pad 314 voltage) as example Equation 1:

$$V_{SB} = IO_{PAD} - 2V_{tn}, \quad (1)$$

where $V_{SB}$ is the second bias voltage 208, $IO_{PAD}$ is the external voltage supplied through the IO pad (IO pad 314 voltage), and $V_{tn}$ is a threshold voltage drop of one active element (e.g., MOS transistor). Here, two NMOS transistors may be used to reduce the second bias voltage 208.

In one or more embodiments, the normal condition may indicate the mode of operation where $V_{DDIO}$ 204 is present, and the IO pad 314 voltage may vary from 0 to $V_{DDIO}$ 204. In one or more embodiments, the tolerant condition may indicate the mode of operation where $V_{DDIO}$ 204 is present, and the IO pad 314 voltage may vary from 0 to a value higher than $V_{DDIO}$ 204. Therefore, a discussion of the circuit operation under a tolerant condition includes the discussion relevant to the circuit operation under a normal condition.

In one or more embodiments, $V_{DDIO}$ 204 (e.g., 2.75 V, or, 2.5 V+10% upper tolerable limit) may be present, as discussed above, in the tolerant mode of operation. As an example, the first bias voltage 206 may then be equal to 1.925 V ($0.7V_{DDIO}$). In one or more embodiments, the first bias voltage 206 may be chosen also to be within an upper tolerable limit of the constituent transistors of the transistor implementation 300. In one or more embodiments, $Q_2$ 304 may be disabled in the multiplexer block 102 during the tolerant operation as the gate (G) terminal of $Q_2$ 304 may be tied to $V_{DDIO}$ 204. In one or more embodiments, the path of the second bias voltage 208 may, therefore, be blocked. In one or more embodiments, $Q_1$ 302 may be turned ON.

In one or more embodiments, regardless of the increase of the IO pad 314 voltage, the output of the multiplexer block 210 may be equal to the first bias voltage 206. For example, when $V_{DDIO}$ 204 is equal to 2.75V, the output of the multiplexer block 210 may be equal to 1.925 V ($0.7V_{DDIO}$).

In one or more embodiments, $V_{DDIO}$ 204 may be equal to 0 during the failsafe operation, as discussed above. In one or more embodiments, the second bias voltage 208 may be derived from the IO pad 314 voltage, which may vary. As an example, when the IO pad 314 voltage varies from 0 to 3.465 V (3.3V+5% upper tolerable limit), the maximum value of the second bias voltage 208 may be 2.1V, as derived from Equation 1 using an IO pad 314 voltage value of 3.465 V (here $V_{tn}$ may approximately be assumed to be 0.68 V).

In one or more embodiments, when the IO pad 314 voltage is low, $Q_2$ 304 may be turned OFF in addition to $Q_1$ 302 (first bias voltage 206 being 0), leading to the output of the multiplexer block 210 being low. In one or more embodiments, when the IO pad 314 voltage increases to a high value, the second bias voltage 208 may also increase. In one or more embodiments, the second bias voltage 208 may be the output of the multiplexer block 210. In one or more embodiments, the output of the multiplexer block 210 may be further ensured to be within the upper tolerable limit of the operating voltage of the IO receiver through the provision of the voltage drop element 316. Therefore, the output of the multiplexer block 210 may then be equal to the second bias voltage 208 minus the drop across the voltage drop element 316.

In one or more embodiments, the transistor implementation 300 may further include a pass MOS transistor $Q_3$ 306. In one or more embodiments, the output of the multiplexer block 210 may be applied to the gate (G) terminal of $Q_3$ 306. In one or more embodiments, the drain (D) terminal of $Q_3$ 306 may be held at the IO pad 314 voltage level, and the bulk (B) terminal of $Q_3$ 306 may be held at $V_{SS}$ 312.

In one or more embodiments, during the tolerant mode of operation, when the IO pad voltage 314 is low, the output of $Q_3$ 306, $V_{OUT}$ 318, taken at the source (S) terminal of $Q_3$ 306, is also low. In one or more embodiments, when the IO pad voltage 314 increases, $Q_3$ 306 may be turned ON, leading to $V_{OUT}$ 318 being equal to the first bias voltage 206 reduced/increased by a threshold voltage of $Q_3$ 306. For example, assuming that the threshold voltage of $Q_3$ 306 may be –0.5 V, when $V_{DDIO}$ 204 increases to 2.75 V and the first bias voltage increases to 1.925 V, $V_{OUT}$ 318 may then be equal to 2.425V. In one or more embodiments, $Q_3$ 306 may be an NMOS transistor or a native MOS transistor. In one or more embodiments, $V_{OUT}$ 318 may be within the upper tolerable limit of the operating voltage of the IO receiver. In one or more embodiments, even when the IO pad 314 voltage increases to a value above the first bias voltage 206 minus the threshold voltage of $Q_3$ 306, $V_{OUT}$ 318 may be clamped close to the value thereof when the IO pad 314 voltage is equal to the first bias voltage 206 minus the threshold voltage of $Q_3$ 306. Note that when the threshold voltage of $Q_3$ 306 is negative, $V_{OUT}$ 318 may be larger than the first bias voltage 206.

In one or more embodiments, during the failsafe mode of operation ($V_{DDIO}$ 204 equal to 0), the first bias voltage 206 may be close to 0, and the second bias voltage 208 may vary as per example Equation 1, depending on the variation of the IO pad 314 voltage. In one or more embodiments, when the IO pad 314 voltage is low, $V_{OUT}$ 318 may also be low. In one or more embodiments, when the IO pad 314 voltage increases, $V_{OUT}$ 318 may also increase/decrease by a threshold voltage of $Q_3$ 306 above/below the output of the multiplexer block 210, depending on the threshold voltage of $Q_3$ 306 being negative/positive. For example, the output of the multiplexer block 210 may increase to 2.1 V, as discussed above, leading to $V_{OUT}$ 318 increasing to 2.6 V (assuming the threshold voltage of $Q_3$ 306 to be –0.5 V). In one or more embodiments, the voltage drop element 316 may provide a leakage path for a voltage drop. In one or more embodiments, $V_{OUT}$ 318, therefore, may further be reduced.

In the above example, $V_{OUT}$ 318 may be reduced to a value below 2.5 V, which is below the upper tolerable limit of the operating voltage of the IO receiver. In one or more embodiments, the transistor implementation 300 of the multiplexer circuit 200 may provide for a reliable interface between the IO pad 314 voltage and the IO receiver during each of the normal mode of operation, the tolerant mode of operation, and the failsafe mode of operation.

In one or more embodiments, the voltage drop element 316 may include a MOS transistor $Q_4$ 308 whose source (S) terminal is connected to a drain (D) terminal of another MOS transistor $Q_5$ 310. In one or more embodiments, the gate (G) terminal and the drain (D) terminal of $Q_4$ 308 may be coupled to the second bias voltage 208. In one or more embodiments, the bulk (B) terminal of $Q_4$ 308 and the source (S) terminal of $Q_5$ 310 may be held at the second supply voltage 312 ($V_{SS}$ 312). In one or more embodiments, the gate (G) terminal of $Q_5$ 310 may be held at the first bias voltage 206. In one or more embodiments, the source (S) terminal of $Q_4$ 308 and the drain (D) terminal of $Q_5$ 310 may both be coupled to the drain (D) terminal of $Q_2$ 304. In one or more embodiments, an output of a Floating Well (FW) circuit may be coupled to the bulk (B) terminal of $Q_5$ 310. As the output of a FW is usually coupled to a PMOS transistor, $Q_5$ 310 may be a PMOS transistor. $Q_4$ 308 is shown in FIG. 3 as an NMOS transistor.

In FIG. 3, $Q_1$ 302 is an NMOS transistor and $Q_2$ 304 is a PMOS transistor. It is obvious to one of ordinary skill in the art that variations in the individual transistors of FIG. 3 are well within the scope of the exemplary embodiments. For example, the pass MOS transistor $Q_3$ 306 may be implemented using a PMOS transistor (where the threshold voltage may be positive), a native MOS transistor or an NMOS transistor.

Figure 4:
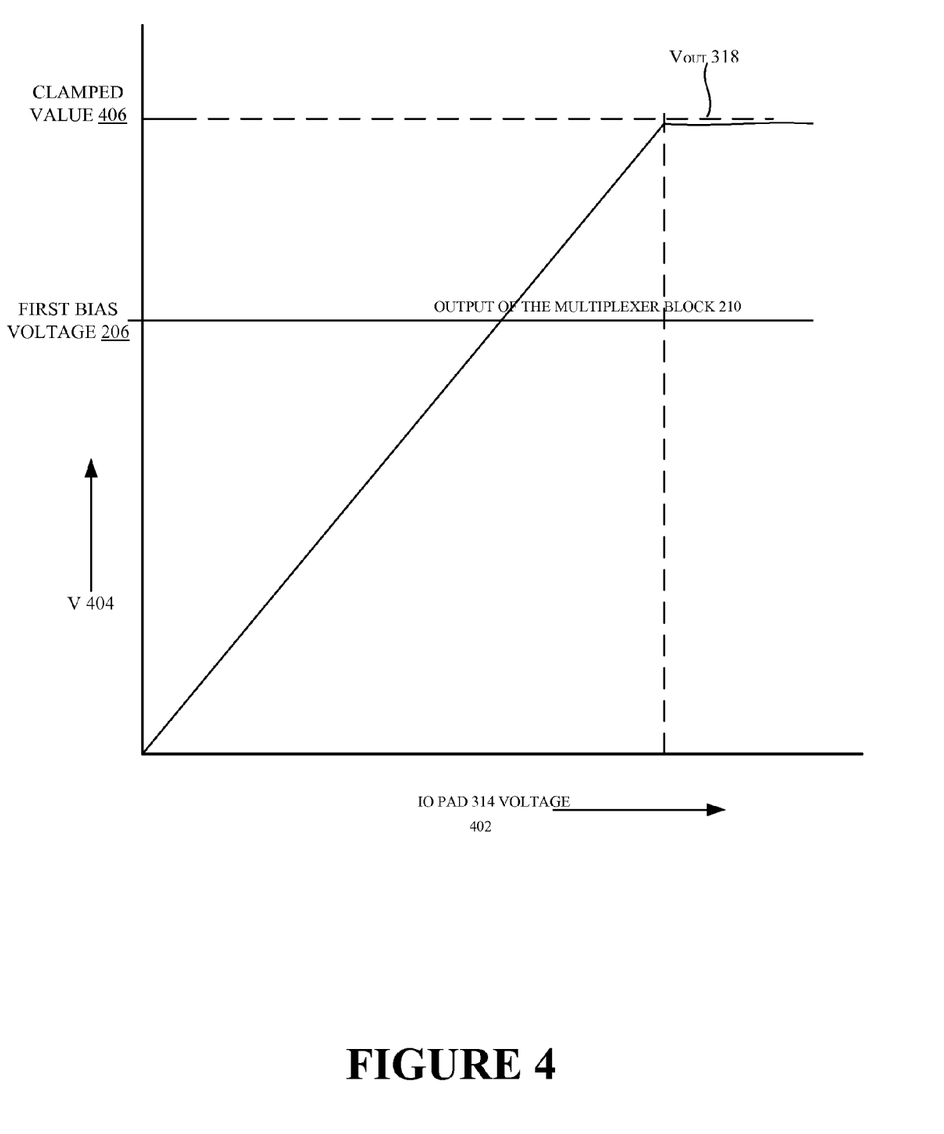
FIG. 4 is a plot of the DC characteristics of the transistor implementation of the multiplexer circuit of FIG. 3 during a tolerant mode of operation, according to one or more embodiments.

FIG. 4 shows the DC characteristics of the transistor implementation 300 of the multiplexer circuit 200 in the tolerant mode of operation, according to one or more embodiments. In one or more embodiments, the x-axis 402 may be the IO pad 314 voltage and the y-axis 404 may be a voltage variable (V). As shown in FIG. 4, when the IO pad 314 voltage is low, $V_{OUT}$ 318 may be low. In one or more embodiments, as the IO pad 314 voltage increases, $V_{OUT}$ 318 may also increase until the IO pad 314 voltage approaches the first bias voltage 206 minus the threshold voltage of $Q_3$ 306, after which $V_{OUT}$ 318 is clamped around the value thereof (clamped value 406 in FIG. 4). FIG. 4 also shows that the output of the multiplexer block 210 may be constant at the first bias voltage 206.

Figure 5:
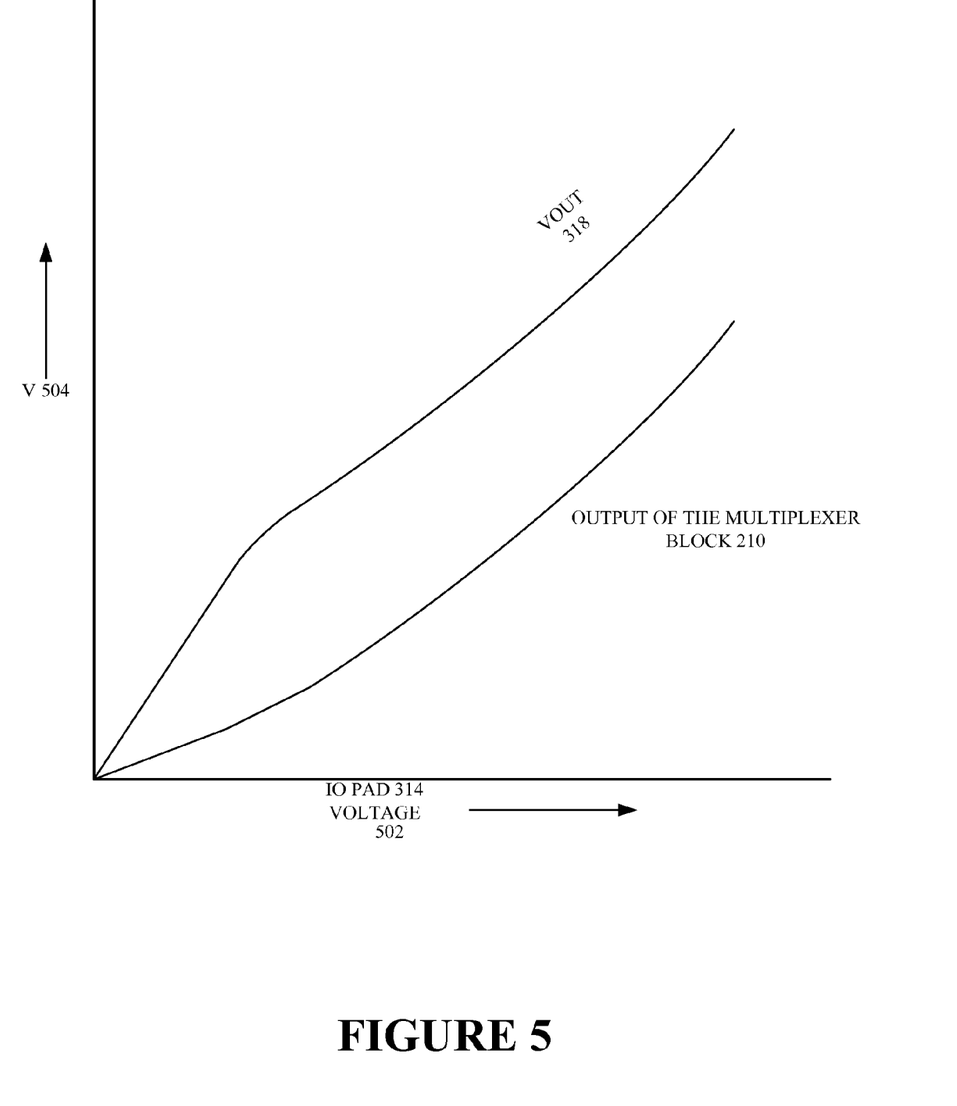
FIG. 5 is a plot of the DC characteristics of the transistor implementation of the multiplexer circuit of FIG. 3 during a failsafe mode of operation, according to one or more embodiments.

FIG. 5 shows the DC characteristics of the transistor implementation 300 of the multiplexer circuit 200 in the failsafe mode of operation, according to one or more embodiments. In one or more embodiments, the x-axis 502 may be the IO pad 314 voltage and the y-axis 504 may be a voltage variable (V). As discussed above, $V_{DDIO}$ 204 may be 0 for the failsafe case. In one or more embodiments, when IO pad 314 voltage may be low, the output of the multiplexer block 210 may also be low, as shown in FIG. 5. In one or more embodiments, as the IO pad 314 voltage increases, the output of the multiplexer block 210 may be derived from the increasing second bias voltage 208, as discussed above and shown in FIG. 5. In one or more embodiments, VOUT 318 may be equal to the output of the multiplexer block 210 minus the threshold voltage of Q3 306, as discussed above and shown in FIG. 5.

Figure 6:
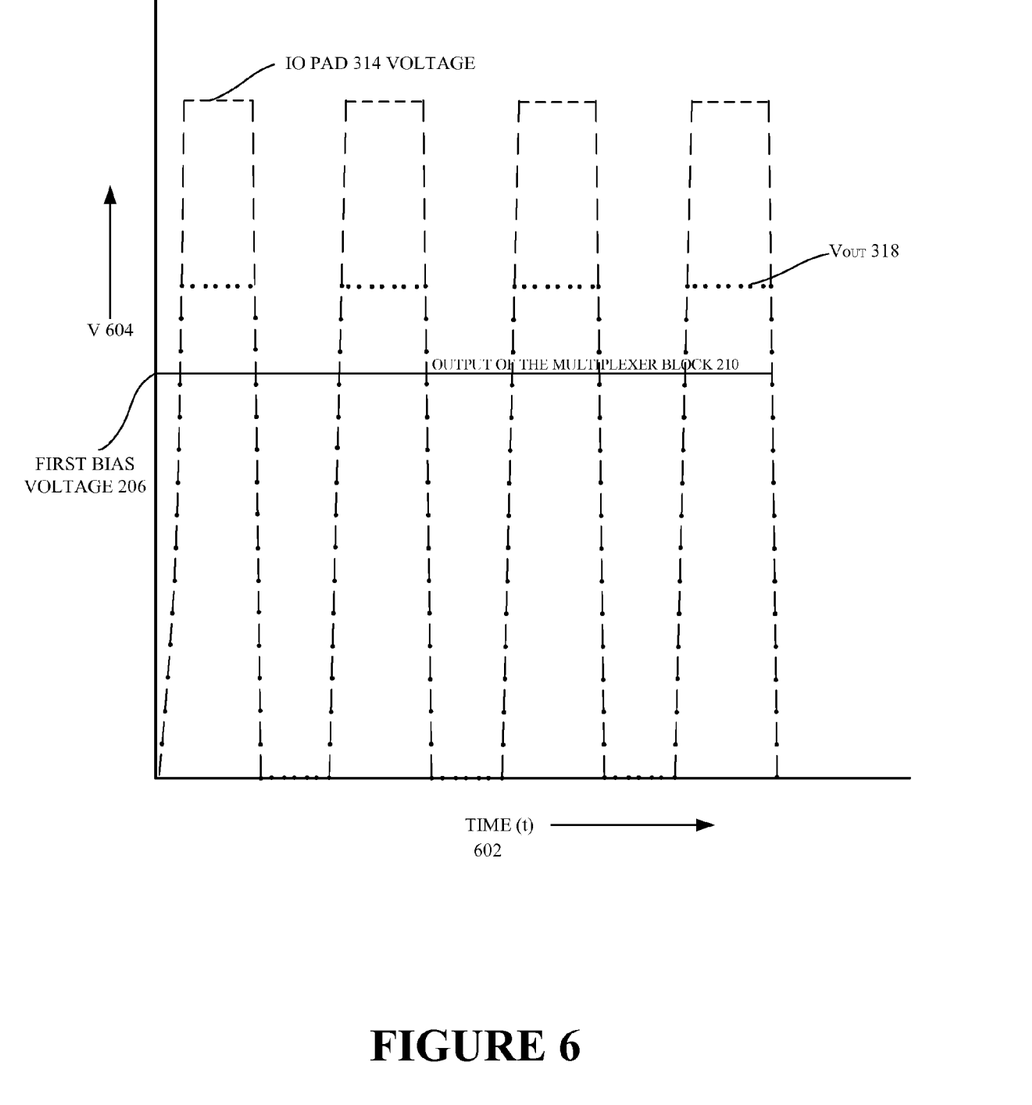
FIG. 6 is a plot of the transient characteristics of the transistor implementation of the multiplexer circuit of FIG. 3 during the tolerant mode of operation, according to one or more embodiments.

FIG. 6 shows the transient characteristics of the transistor implementation 300 of the multiplexer circuit 200 in the tolerant mode of operation, according to one or more embodiments. In one or more embodiments, the x-axis may denote time (t) 602 and the y-axis 604 may indicate a voltage variable (V). In one or more embodiments, as the IO pad 314 voltage switches from a value above the first bias voltage 206 to 0 and 0 to the value above the first bias voltage 206, the output of the multiplexer block 210 may stay constant at the first bias voltage 206. In one or more embodiments, $V_{OUT}$ 318 may closely follow the IO pad 314 voltage unit it equals the first bias voltage 206 minus the threshold voltage of Q3 306, following which it is clamped at the value thereof. In one or more embodiments, as the IO pad 314 voltage switches from the maximum value to 0, $V_{OUT}$ 318 may closely follow the IO pad 314 voltage to 0, as shown in FIG. 6.

Figure 7:
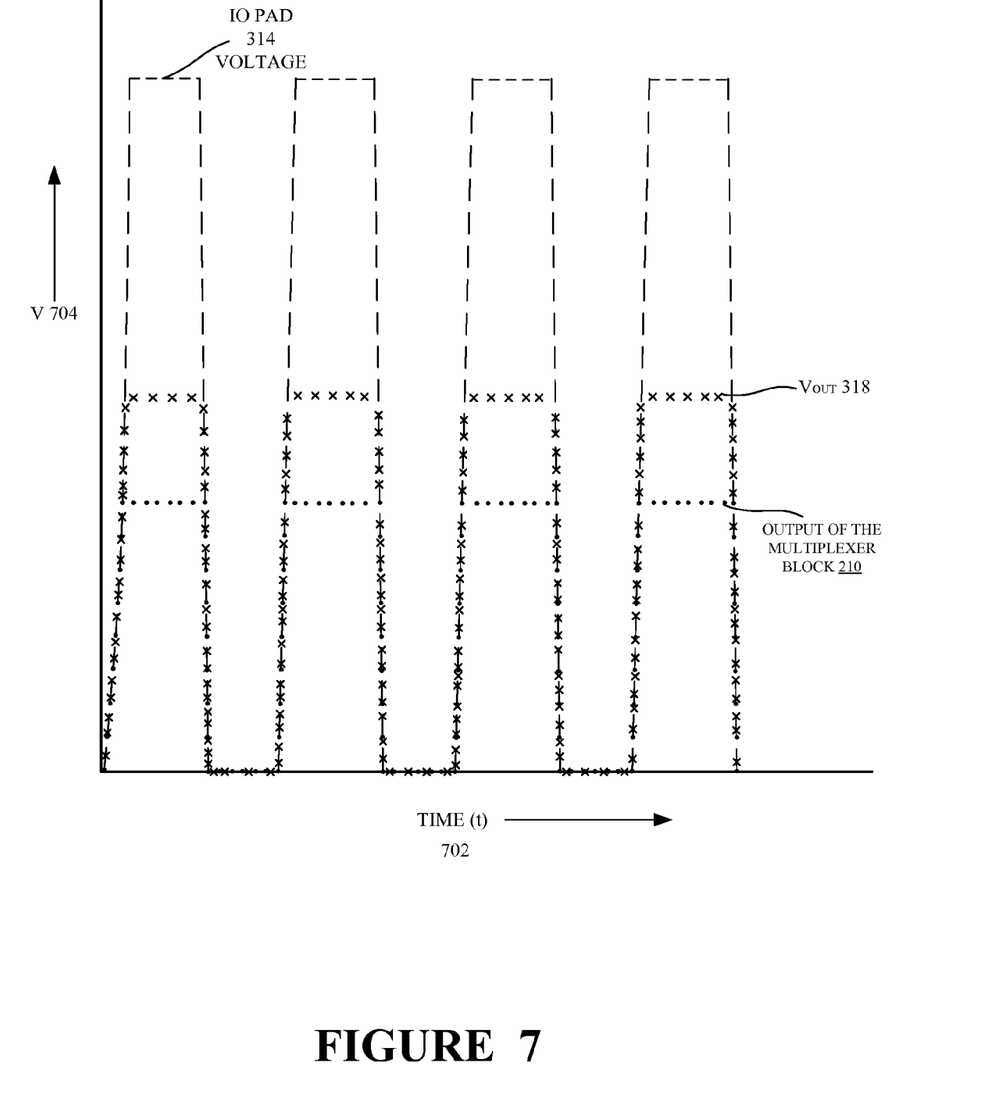
FIG. 7 is a plot of the transient characteristics of the transistor implementation of the multiplexer circuit of FIG. 3 during the failsafe mode of operation, according to one or more embodiments.

FIG. 7 shows the transient characteristics of the transistor implementation 300 of the multiplexer circuit 200 in the failsafe mode of operation, according to one or more embodiments. In one or more embodiments, the x-axis may denote time (t) 702, and the y-axis 704 may indicate a voltage variable (V). In one or more embodiments, as the IO pad 314 voltage switches from 0 to a highest value thereof and from the highest value to 0, the output of the multiplexer block 210 may be derived from the second bias voltage 208. In one or more embodiments, $V_{OUT}$ 318 may be derived from the output of the multiplexer block 210 as the output of the multiplexer block 210 minus the threshold voltage of $Q_3$ 306, as discussed above and as shown in FIG. 7.

Figure 8:
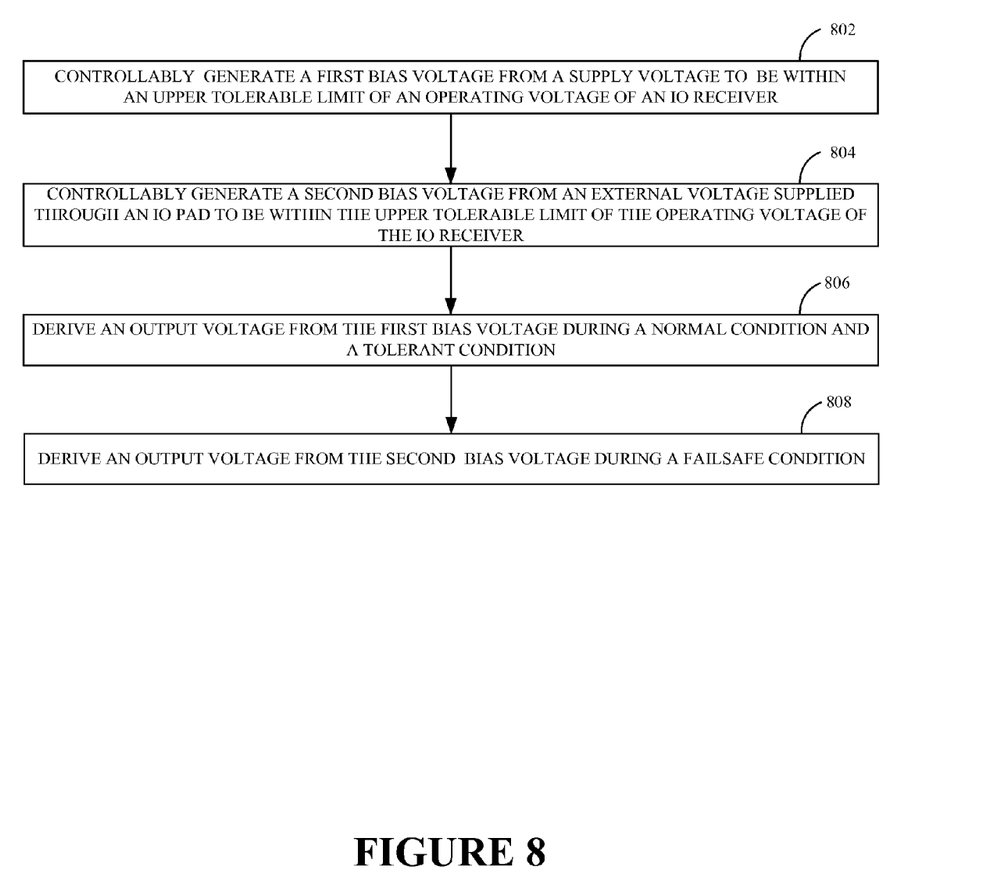
FIG. 8 is a process flow detailing the operations involved in a method of deriving an output voltage to be interfaced with an IO receiver, according to one or more embodiments.

FIG. 8 is a process flow detailing the operations involved in a method of deriving the output voltage to be interfaced with an IO receiver, according to one or more embodiments. In one or more embodiments, operation 802 may include controllably generating the first bias voltage 206 from the supply voltage 204 ($V_{DDIO}$ 204) to be within the upper tolerable limit of the operating voltage of the IO receiver. In one or more embodiments, operation 804 may include controllably generating the second bias voltage 208 from the external voltage supplied through the IO pad (IO pad 314 voltage). In one or more embodiments, the second bias voltage 208 may be within the upper tolerable limit of the operating voltage of the IO receiver.

In one or more embodiments, operation 806 may include deriving the output voltage from the first bias voltage 206 during the normal condition and the tolerant condition. In one or more embodiments, the tolerant condition may be a mode of operation where the external voltage supplied through the IO pad varies from zero to a value higher than the supply voltage. In one or more embodiments, operation 808 may include deriving the output voltage from the second bias voltage 208 during the failsafe condition. In one or more embodiments, the failsafe condition may be a mode of operation where the supply voltage is zero.

Figure 9:
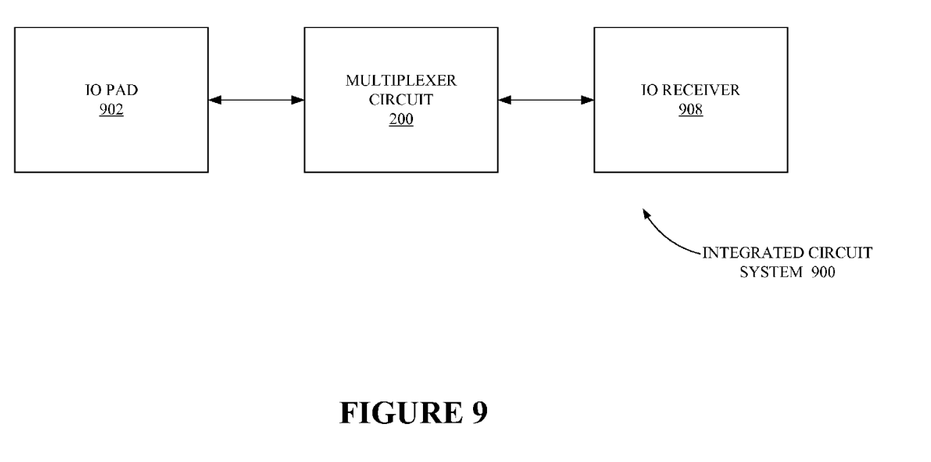
FIG. 9 is a system view of an IC system including the multiplexer circuit of FIG. 2, according to one or more embodiments.

FIG. 9 shows an integrated circuit (IC) system 900, according to one or more embodiments. In one or more embodiments, the multiplexer circuit 200 may reliably interface the higher voltage at the IO pad 902 (e.g., 3.465 V) with the IO receiver 908 such that the input voltage at the IO receiver is within the upper tolerable limit of the operating voltage of the IO receiver 908 (e.g., 2.5 V).

Although the present embodiments have been described with reference to specific example embodiments, it will be evident that various modifications and changes may be made to these embodiments without departing from the broader spirit and scope of the various embodiments. For example, variations in operating voltages and/or external voltages are within the scope of the exemplary embodiments. Also, for example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). Accordingly, the specification and drawings are to be regarded in an illustrative rather than a restrictive sense.

What is claimed is:

1. A method comprising:
   controllably generating a first bias voltage from a supply voltage to be within an upper tolerable limit of an operating voltage of an Input/Output (IO) receiver;
   controllably generating a second bias voltage from an external voltage supplied through an IO pad, the second bias voltage being within the upper tolerable limit of the operating voltage of the IO receiver;
   deriving an output voltage from the first bias voltage during a normal condition and a tolerant condition, the tolerant condition being a mode of operation where the external voltage supplied through the IO pad varies from zero to a value higher than the supply voltage; and
   deriving the output voltage from the second bias voltage during a failsafe condition, the failsafe condition being a mode of operation where the supply voltage is zero.

2. The method of claim 1, comprising controllably generating a fraction of the supply voltage as the first bias voltage.

3. The method of claim 1, comprising controllably generating the second bias voltage by reducing the external voltage supplied through the IO pad by a threshold voltage of at least one active element.

4. The method of claim 1, comprising multiplexing the first bias voltage and the second bias voltage to output one of the first bias voltage and the second bias voltage based on the corresponding one of a presence and an absence of the supply voltage.

5. The method of claim 4, wherein multiplexing the first bias voltage and the second bias voltage further comprises:
   receiving the first bias voltage at one of a source terminal and a drain terminal of a first MOS transistor;
   receiving the second bias voltage at one of a source terminal and a drain terminal of a second MOS transistor;
   receiving the supply voltage at each of a gate terminal of the first MOS transistor and the second MOS transistor; and
   coupling the one of the source terminal and the drain terminal of the first MOS transistor not receiving the first bias voltage to the one of the source terminal and the drain terminal of the second MOS transistor not receiving the second bias voltage.

6. The method of claim 5, further comprising:
   coupling a bulk terminal of the first MOS transistor to a second supply voltage;
   coupling the one of the source terminal and the drain terminal of the second MOS transistor not receiving the second bias voltage to a bulk terminal of the second MOS transistor; and
   deriving the output of the multiplexing from one of the first bias voltage during the normal condition and the tolerant condition and the second bias voltage during the failsafe operation through a path coupling the one of the source terminal and the drain terminal of the first MOS transistor not receiving the first bias voltage and the one of the source terminal and the drain terminal of the second MOS transistor not receiving the second bias voltage.

7. The method of claim 6, further comprising:
applying the output of the multiplexing to a gate terminal of a pass MOS transistor;
coupling one of a source terminal and a drain terminal of the pass MOS transistor to the external voltage supplied through the IO pad;
coupling a bulk terminal of the pass MOS transistor to the second supply voltage; and
deriving the output voltage from the output of the multiplexing as an output from the one of the source terminal and the drain terminal of the pass MOS transistor not coupled to the external voltage supplied through the IO pad.

8. The method of claim 7, further comprising reliably interfacing the output voltage derived from the output of the multiplexing with the IO receiver.

9. The method of claim 7, further comprising ensuring the output voltage derived from the output of the multiplexing to be within the upper tolerable limit of the operating voltage of the IO receiver by providing a leakage path for the second bias voltage.

10. A circuit comprising:
a multiplexer block:
configured to receive a first bias voltage controllably generated from a supply voltage and a second bias voltage controllably generated from an external voltage supplied through an IO pad, the first bias voltage and the second bias voltage being within an upper tolerable limit of an operating voltage of an IO receiver, and
configured to output one of the first bias voltage during a normal condition and a tolerant condition and an output based on the second bias voltage during a failsafe condition based on a corresponding one of a presence and an absence of the supply voltage,
wherein the tolerant condition is a mode of operation where the external voltage supplied through the IO pad varies from zero to a value higher than the supply voltage, and
wherein the failsafe condition is a mode of operation where the supply voltage is zero.

11. The circuit of claim 10, wherein:
the first bias voltage is a fraction of the supply voltage, and
the second bias voltage is equal to the external voltage supplied through the IO pad reduced by a threshold voltage of at least one active element.

12. The circuit of claim 10, wherein the multiplexer block comprises:
a first MOS transistor configured to receive the first bias voltage at one of a source terminal and a drain terminal thereof; and
a second MOS transistor configured to receive the second bias voltage at one of a source terminal and a drain terminal thereof,
wherein each of a gate terminal of the first MOS transistor and the second MOS transistor is configured to receive the supply voltage, and
wherein the one of the source terminal and the drain terminal of the first MOS transistor not configured to receive the first bias voltage is configured to be coupled to the one of the source terminal and the drain terminal of the second MOS transistor not configured to receive the second bias voltage.

13. The circuit of claim 12, wherein:
a bulk terminal of the first MOS transistor is configured to be coupled to a second supply voltage,
the one of the source terminal and the drain terminal of the second MOS transistor not configured to receive the second bias voltage is configured to be coupled to a bulk terminal of the second MOS transistor, and
the output of the multiplexer block is derived from a path configured to couple the one of the source terminal and the drain terminal of the first MOS transistor not configured to receive the first bias voltage and the one of the source terminal and the drain terminal of the second MOS transistor not configured to receive the second bias voltage.

14. The circuit of claim 13, further comprising a pass MOS transistor configured to
receive the output of the multiplexer block at a gate terminal thereof,
wherein one of a source terminal and a drain terminal of the pass MOS transistor is configured to be coupled to the external voltage supplied through the IO pad,
wherein a bulk terminal of the pass MOS transistor is configured to be coupled to the second supply voltage; and
wherein an output voltage is derived from the one of the source terminal and the drain terminal of the pass MOS transistor not configured to be coupled to the external voltage supplied through the IO pad.

15. The circuit of claim 14, wherein the output voltage derived from the one of the source terminal and the drain terminal of the pass MOS transistor not configured to be coupled to the external voltage supplied through the IO pad is interfaced with the IO receiver.

16. The circuit of claim 14, further comprising a leakage path for the second bias voltage to ensure that the output voltage derived from the one of the source terminal and the drain terminal of the pass MOS transistor not configured to be coupled to the external voltage supplied through the IO pad is within the upper tolerable limit of the operating voltage of the IO receiver.

17. An integrated circuit system comprising:
an IO pad of an integrated circuit;
an IO receiver; and
an IO interface circuit configured to interface the IO pad of the integrated circuit with the IO receiver, the IO interface circuit comprising:
a multiplexer block:
configured to receive a first bias voltage controllably generated from a supply voltage and a second bias voltage controllably generated from an external voltage supplied through the IO pad of the integrated circuit, the first bias voltage and the second bias voltage being within an upper tolerable limit of an operating voltage of the IO receiver, and
configured to output one of the first bias voltage during a normal condition and a tolerant condition and an output based on the second bias voltage during a failsafe condition based on a corresponding one of a presence and an absence of the supply voltage,
wherein the tolerant condition is a mode of operation where the external voltage supplied through the IO pad of the integrated circuit varies from zero to a value higher than the supply voltage, and
wherein the failsafe condition is a mode of operation where the supply voltage is zero.

18. The integrated circuit system of claim 17, wherein:
the first bias voltage is a fraction of the supply voltage, and
the second bias voltage is equal to the external voltage supplied through the IO pad of the integrated circuit reduced by a threshold voltage of at least one active element.

19. The integrated circuit system of claim 17, wherein the multiplexer block comprises:
- a first MOS transistor configured to receive the first bias voltage at one of a source terminal and a drain terminal thereof; and
- a second MOS transistor configured to receive the second bias voltage at one of a source terminal and a drain terminal thereof,
- wherein each of a gate terminal of the first MOS transistor and the second MOS transistor is configured to receive the supply voltage, and
- wherein the one of the source terminal and the drain terminal of the first MOS transistor not configured to receive the first bias voltage is configured to be coupled to the one of the source terminal and the drain terminal of the second MOS transistor not configured to receive the second bias voltage.

20. The integrated circuit system of claim 19, wherein
a bulk terminal of the first MOS transistor is configured to be coupled to a second supply voltage,
the one of the source terminal and the drain terminal of the second MOS transistor not configured to receive the second bias voltage is configured to be coupled to a bulk terminal of the second MOS transistor, and
the output of the multiplexer block is derived from a path configured to couple the one of the source terminal and the drain terminal of the first MOS transistor not configured to receive the first bias voltage and the one of the source terminal and the drain terminal of the second MOS transistor not configured to receive the second bias voltage.

* * * * *